United States Patent [19]

Shaffer et al.

[11] 4,326,240
[45] Apr. 20, 1982

[54] MULTILAMP PHOTOFLASH UNIT HAVING ENGAGEABLE CONNECTOR TAB

[75] Inventors: John W. Shaffer, Williamsport; David R. Broadt, Lewisburg, both of Pa.

[73] Assignee: GTE Products Corporation, Stamford, Conn.

[21] Appl. No.: 181,934

[22] Filed: Aug. 27, 1980

[51] Int. Cl.³ ............................................. G03B 15/02
[52] U.S. Cl. ........................................ 362/11; 362/15; 362/16
[58] Field of Search ..................... 362/3, 5, 11, 13, 14, 362/15, 16, 185, 189, 196, 198, 200, 213, 240, 278, 310, 320; 206/418, 419, 420, 476; 53/559; 354/143; 339/17 L; 431/359

[56] References Cited

U.S. PATENT DOCUMENTS

| | | | |
|---|---|---|---|
| 3,140,907 | 7/1964 | Davies | 339/17 L |
| 3,454,756 | 7/1969 | Iwata et al. | 362/13 |
| 3,473,880 | 10/1969 | Wick | 362/13 |
| 3,512,332 | 5/1970 | Klein | 53/559 |
| 3,857,667 | 12/1974 | Vetere et al. | 362/11 |
| 3,920,371 | 11/1975 | Faller | 53/559 |
| 4,153,365 | 5/1979 | English et al. | 362/13 |

Primary Examiner—Donald P. Walsh
Attorney, Agent, or Firm—Edward J. Coleman

[57] ABSTRACT

A photoflash unit comprising a horizontal linear array of flashlamps enclosed within a one-piece housing member having a light-transmitting front portion folded over a back portion containing a plurality of lamp-receiving cavities in which respective lamps are disposed. A printed circuit board is joined to the housing member, and a pair of lead-in wires from each of the lamps are connected to conductive circuit patterns disposed solely on one side of the circuit board. The circuit patterns include a plurality of connector terminals which are located adjacent one another on a flat tab which projects from one edge of the circuit board for insertion into the receiving socket of a firing pulse source. The tab contains a plurality of symmetrically disposed apertures or recesses which render the tab releasably engageable by socket means independent of firing pulse contacts for securely retaining the unit in the socket.

11 Claims, 6 Drawing Figures

MULTILAMP PHOTOFLASH UNIT HAVING ENGAGEABLE CONNECTOR TAB

BACKGROUND OF THE INVENTION

This invention relates to multilamp photoflash units, and more particularly, to photoflash units having a printed circuit board with a flat connector tab projecting therefrom.

Presently available multilamp photoflash units of the cube-shaped type, such as those referred to as flashcube and magicube, have means for securely holding the flash unit within the receiving socket of a camera or photoflash accessory. More specifically, these units are provided with a base retaining post having either protuberances or depressions symmetrically disposed on four sides of the post which are releasably engaged by resilient fingers within the receiving socket upon insertion, thereby providing a secured detent latching. Such base latching arrangements are described in U.S. Pat. Nos. 3,327,106; 3,602,618; 3,612,849; and 3,691,508.

Another multilamp photoflash unit presently on the market and referred to as a flip flash includes a printed circuit board with a flat connector tab which is partially enclosed in an extension of the unit housing. In addition to protecting the connector tabs, the housing extension also is configured to have recesses and protuberences for facilitating secure detent latching within a receiving socket. For example, a flip flash array is described in U.S. Pat. No. 3,935,442, and the socket latching arrangement for the flip flash unit is described in U.S. Pat. No. 3,941,447.

In the case of another currently popular linear array of photoflash lamps referred to as a flash bar, however, the connecting means for the unit comprises a projecting flat connector tab of a printed circuit board, and retention of the unit in a receiving socket is provided solely by the pressure of resilient contacts against flat conductor terminals on the connector tab. There is no provision for secure latching by means such as a detent arrangement. The connector and socket arrangement for the flash bar is described in U.S. Pat. Nos. 3,757,643 (FIG. 3 thereof) and 3,598,985 (FIG. 4 thereof).

U.S. Pat. No. 3,430,545 describes another linear photoflash array in which a depending connector tab has a plurality of selective terminals on the front side of the tab, while a single elongated common terminal strip is disposed transversely across the rear side of the tab. A plurality of recesses are provided through the common terminal strip on the rear side of the tab, and when the unit is inserted in the corresponding receiving socket, a spring loaded contact, or electrode, within the socket is provided with a row of projections which snap into the complimentary recesses of the tab so that the unit is held against unintentional displacement. U.S. Pat. No. 3,473,880 shows another linear array having but one terminal on each side of a depending tab. Each terminal appears to be provided with an indentation, perhaps for retaining purposes.

It is a purpose of the present invention to provide means for increasing the holding power of a receiving socket upon any photoflash unit having an interface consisting solely of a flat connector tab, such as that of the flash bar. Further, it is desired that the increased retention be obtained without involving the electrical tab terminals and socket contacts in a detent arrangement. Also, the approach should be suitable for circuit board and tab configurations wherein all conductor patterns and terminals are on the same one side of the board.

SUMMARY OF THE INVENTION

Accordingly, it is an object of the present invention to provide an improved multilamp photoflash unit having a flat connector tab adapted for secure retention in a receiving socket.

Another object of the invention is to provide a multilamp photoflash unit having a simplified, cost-efficient construction with improved connector means.

A further object is to provide a photoflash unit having a printed circuit board with an improved connector tab for enabling secure retention of the unit within a receiving socket.

These and other objects, advantages and features are attained in a multilamp photoflash unit including a plurality of flashlamps having lead-in wires secured in electrical connection to conductive patterns on a printed circuit board. A plurality of terminal areas forming part of the conductive patterns on the circuit board are located adjacent to one another on a flat tab which projects from one edge of the circuit board. All of the conductive patterns including the terminal areas are disposed on the same one side of the circuit board. A plurality of engageable means in the form of apertures or recesses are contained on the projecting tab and spaced apart from both the terminal areas and the edge of the circuit board. The tab is insertable in a receiving socket of a firing pulse source for connecting the terminal areas to respective contacts of the firing pulse source, and the apertures or recesses render the tab releasably engageable by socket means independent of the firing pulse contacts for securely retaining the photoflash unit in the socket.

In a preferred embodiment, the engageable means of the tab are symmetrically disposed thereon and, in one implementation, comprise two rectangular openings symmetrically disposed on opposite sides of the plurality of terminal areas. In a particularly useful embodiment, the photoflash unit further includes a one-piece housing member having a light-transmitting front portion folded over a back portion containing a plurality of lamp receiving cavities, each of the flashlamps is disposed in a respective one of the cavities and enclosed by the folded-over housing member, the circuit board is joined to the housing member, and the tab of the circuit board containing the terminal areas and engageable means extends below the folded-over housing member.

Hence, a very compact, simplified and cost-efficient photoflash unit is provided with a connector tab that may be securely, but releasably, locked into a receiving socket. The latch means is independent of the electrical terminals on the tab and the mating electrical contacts of the socket; that is, existing terminal arrangements and mating slide contacts do not have to be altered to provide detent configurations. Further, the tab engagement means is suitable for use with circuit boards having all of the conductive patterns on the same side and permits interchangeability of existing terminal contact configurations with minimum socket redesign to provide for the releasable engagement feature.

BRIEF DESCRIPTION OF THE DRAWINGS

This invention will be more fully described hereinafter in conjunction with the accompanying drawings, in which.

DESCRIPTION OF PREFERRED EMBODIMENTS

Figure 1:
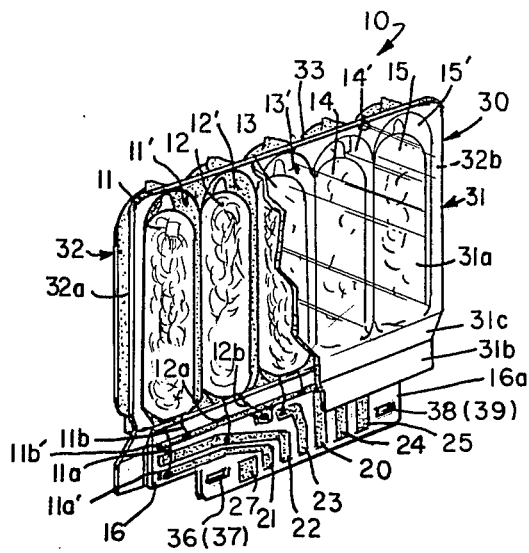
FIG. 1 is a perspective view of one embodiment of a multilamp photoflash unit having an engageable projecting tab in accordance with the invention, the view being shown partly broken away in section to more clearly illustrate the construction thereof.

FIG. 1 illustrates an embodiment of a multilamp photoflash unit 10 comprising a horizontal array of five flash lamps 11-15 mounted on a printed circuit board 16. Each of the lamps has a pair of lead-in wires 11a, 11b, etc. connected to the printed circuitry on the board 16. For example, the lead-in wires 11a, 11b, etc. may be soldered to respective lamp contact areas 11a', 11b', etc., forming portions of conductive circuit patterns on the circuit board 16 (see FIG. 2). Each of the lamps 11, etc., has a tubular light-transmitting glass envelope having a press seal at one end through which the lead-in wires emerge, and a tip-off at the other end. The exterior of the envelope is coated with a transparent protective material, such as cellulose acetate lacquer, and the interior is filled with a quantity of filamentary combustible material, such as shredded zirconium, and a combustion supporting gas, such as oxygen. The ignition means within the lamp envelope may comprise, in the case of a low voltage source, a filament connected across the inner ends of the lead-in wires with beads of primer material disposed about the junction of the lead-in wires and the filament.

When the flashlamps are mounted and positioned on the circuit board 16, the lead-in wires 11a, 11b, etc., are bent, as illustrated, so that at all of the tubular envelopes of the lamps are positioned with the longitudinal axes thereof lying in a plane which is offset from but substantially parallel to the surface of the printed circuit board 16 and arranged in a horizontal array, as illustrated.

Figure 2:
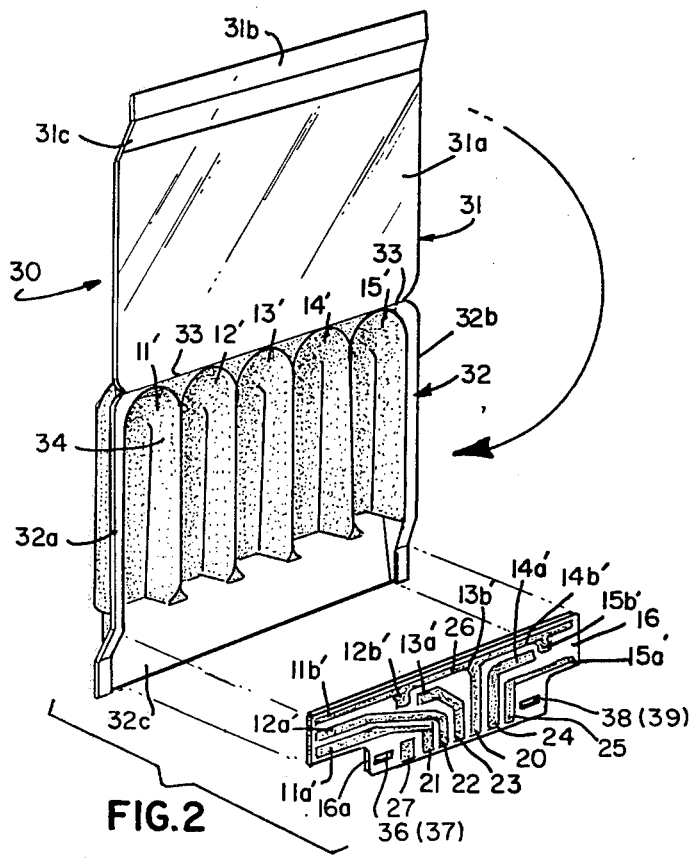
FIG. 2 is a perspective view, in unfolded form, of the one-piece housing of the unit of FIG. 1 in exploded relation to the associated printed circuit board, without showing the attached lamp.

Referring also to FIG. 2, the circuit board 16 has a "printed circuit" thereon for enabling selective flashing of the lamps in response to flash atuation signals in the form of applied firing voltage pulses. In the particular embodiment illustrated in FIGS. 1 and 2, the entire printed circuit is provided on the same one side of the circuit board, namely, the obverse side of the board to which the flashlamp lead-in wires are connected. The substrate of the circuit board 16 comprises an insulating material, such as XP phenolic, and the pattern of electrically conductive circuit runs is provided on the board surface by means such as silk screening, chemical etching, etc. According to a preferred embodiment, however, the circuit patterns are formed of die-stamped copper, thereby providing significant cost advantages. For example, U.S. Pat. No. 3,990,142 describes a die-stamped printed circuit board, and copending applications Ser. Nos. 131,614 and 131,711, both filed Mar. 19, 1980 and assigned to the present assignee, describe die-stamped circuit boards for photoflash devices.

The circuit board 16 has a substantially rectangular shape with a flat projecting tab 16a which is significantly narrower than the long lower side of the circuit board from which the tab projects. Located adjacent to one another on the tab are a plurality of terminal areas 20-25 at one side edge thereof which are selectively interconnected via conductor runs with a plurality of lamp contact areas 11a', 11b' through 15a', 15b'. More specifically, the terminal 20 forms part of and is connected to a common circuit conductor run 26 which is connected electrically to one lead-in wire of each of the flashlamps at lamp contact areas 11b',-15b', respectively. The terminals 21-25 are each directly connected to a respective one of the non-common lead-in wires of a respective one of the lamps. That is, selective terminal 21 is directly connected to the lamp contact area 11a'; selective terminal 22 is directly connected to lamp contact areas 12a'; selective terminal 23 is directly connected to lamp contact area 13a'; the selective terminal 24 is directly connected to lamp contact area 14a'; and the selective terminal 25 is directly connected to lamp contact area 15a'.

The common terminal 20 and the five selective terminals 21-25 on tab 16a are adapted for slidable engagement with the socket contacts of a source of lamp firing pulses. For example, the source of firing pulses for connection to these terminals may comprise an electronic circuit such as that described in U.S. Pat. No. 3,618,492, which may be incorporated in a camera or a flash attachment for use with the camera and adapted to generate low voltage pulses in synchronization with the actuation of a camera shutter mechanism. Also shown on tab 16a is a conductive strip 27 for slidable bridging camera socket contacts to convert the camera to a flash mode of operation, as described in U.S. Pat. No. 3,757,643.

As described in a copending application Ser. No. 181,936 filed concurrently herewith and assigned to the same assignee, the unit enclosure comprises a one-piece housing member 30 having a light-transmitting front portion 31 folded over a back portion 32 containing a plurality of, in this case five, lamp-receiving cavities 11'-15', which may have a reflective coating 34. Preferably, the housing member comprises a formed sheet of plastic film, such as cellulose propionate having a thickness of about 30 mils, prepared by injection molding, thermoforming of plastic sheet or film, or any other suitable means. As best shown in the unfolded illustration of FIG. 2, the housing member contains a linear fold 33 which separates the front and back portions, and when the housing is folded over, this linear fold 33 is disposed horizontally along the top of the horizontal array of lamp-receiving cavities 11'-15'.

In order to facilitate securing of the housing once it is folded over, the back portion 32 is provided with side flanges 32a and 32b, which extend on each side of the array of cavities, and an elongated tab 32c (FIG. 2) which extends below the array of cavities. The front portion 31 of the housing includes a transparent window area 31a, which is substantially planar, and an elongated tab 31b which extends below the window area and it is disposed in a plane which is substantially parallel to but offset from the plane of the window area.

The front portion 31 further includes a web 31c which joins window area 31a with the tab 31b.

Figures 3, 4:
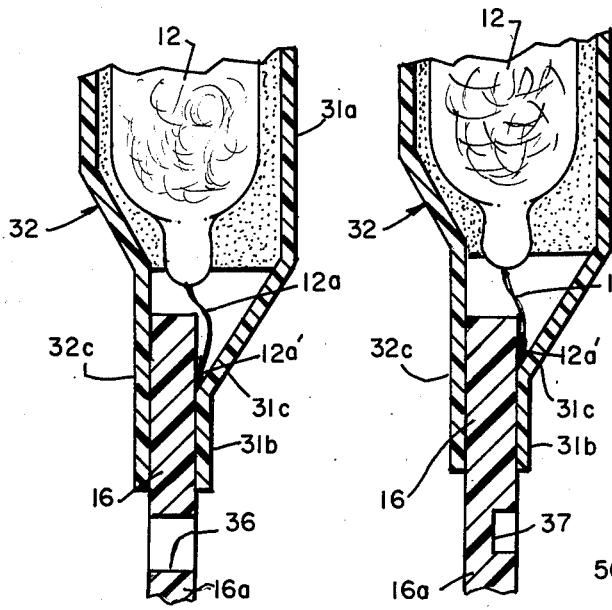
FIG. 3 is a fragmentary sectional view of the unit of FIG. 1 showing an opening through the projecting tab thereof.
FIG. 4 is a fragmentary sectional view of a alternative embodiment of the unit of FIG. 1 showing a recess in the projecting tab.

In assembly of the unit, the lead-in wires of the flashlamps are soldered to the appropriate lamp contact areas on the printed circuit board 16, and then the circuit board is aligned against tab 32c of the housing, with each of the lamps 11-15 disposed in a respective one of the cavities 11'-15'. The front portion of the housing is then folded over, with the circuit board 16 sandwiched between tabs 31b and 32c and with the window area 31a enclosing the lamps in their respective cavities. In this manner, the window area is essentially adjacent to the lamps, and the top and side peripheries of the lamp receiving cavities are substantially in abutment with the window area of the folded over front portion so that individual chambers enclose each of the lamps. The bottom of each such chamber has an opening, as illustrated, through which each pair of lamp lead-in wires pass through to their electrical connection areas on the circuit board. In this manner, as is best illustrated in FIG. 3, the housing web 31c encloses the lamp lead-in wires and the contact areas on the circuit board to which the wires are connected. The sides and bottom of the housing are then secured, such as by use of an adhesive. More specifically, the back housing side flanges 32a and 32b align with side portions of the front window area 31a such that an adhesive or other securing means may be disposed therebetween. As illustrated, the side flanges 32a and 32b may extend from the top to the bottom of the back portion of the unit, following the offset between the front periphery of the cavities and tab 32c, and thereby align with each full side of the front portion of the housing. That is, flanges 32a and 32b align with respective sides of the window area 31a, the web 31c, and the tab 31b. At the bottom, tabs 32c and 31b are secured to each side of the circuit board, such as by an adhesive.

In order to facilitate engagement of the terminal areas 20-25 with the socket contacts of a source of lamp firing pulses, such as a camera or flash attachment, the projecting tab 16a of the circuit board extends below and exteriorly of the secured housing enclosure, as shown in FIGS. 1 and 3, to expose these terminal areas.

Figure 5:
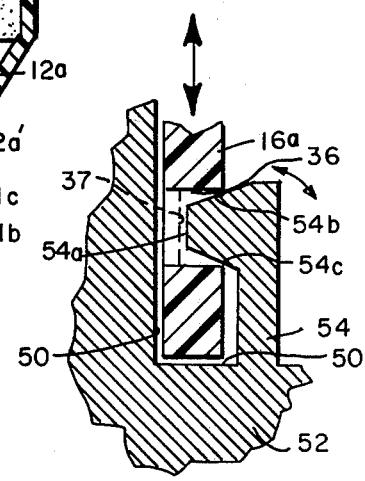
FIG. 5 is a fragmentary sectional view illustrating the projecting tab engaged in a socket.

In accordance with the invention, secure connection of the photoflash unit 10 into the camera or flash attachment socket is enabled by providing a pair of symmetrically disposed rectangular openings 36 and 38 through the tab 16a, as shown in FIGS. 1-3. Preferably, the openings 36 and 38 are symmetrically disposed on opposite sides of the plurality of conductive areas including strip 27 and terminals 20-25, as illustrated. Further, in accordance with the invention, the openings 36 and 38 are spaced apart from the conductor strip 27 and terminal areas 20-25, and also spaced apart from the lower side edge of the printed circuit tab 16a. In this manner, as shown in FIG. 5, when the tab 16a is inserted in a receiving socket 50 of a firing pulse source, such as a camera housing 52, the tab openings 36 and 38 are releasably engageable by socket means independent of the firing pulse contacts for securely retaining the photoflash unit in the socket. For example, as illustrated in FIG. 5, the receiving socket may include a pair of resilient fingers 54 (only one being shown) each of which has a projection 54a for fitting into a corresponding opening 36 or 38 in the tab 16a. The resilient fingers 54 may, for example, be molded of plastic and be totally independent of the conductive metal circuit contacts. Further, as illustrated, the projections 54a on the resilient fingers are provided with upper and lower ramps 54b and 54c, respectively, to facilitate both insertion and subsequent removal of the photoflash unit. Thus, upon insertion of tab 16a in the socket shown in FIG. 5, the lower portion of the tab slides against ramp 54b causing the resilient finger 54 to deflect toward the right (in the drawing); then when opening 36 is aligned with the projection 54a, the resilient finger 54 snaps back into its normal position, whereby the projection 54a is inserted into opening 36 (the other tab of the pair being inserted into opening 38) to thereby securely lock the tab 16a, and thus the photoflash unit 10, into the socket 50. When it is desired to remove the photoflash unit, upward movement of the unit, and thus tab 16a, causes the lower portion of opening 36 (or 38) to slide against ramp 54c and thereby cause the resilient finger 54 to be deflected again to the right, thereby facilitating removal of the photoflash unit.

FIG. 4 shows an alternative embodiment wherein the engageable means in the tab comprises a recess 37 in lieu of an opening 36. Thus, a represented by the numerals in parenthesis in FIGS. 1 and 2, the engageable tab means may comprise rectangular recesses 37 and 39 symmetrically disposed on each side of the plurality of conductive areas 20-25 and 27 and spaced apart from those areas and the edge of the tab. Of course, it will be appreciated that the engageable means according to the invention may comprise shapes other than rectangular and may include more than two apertures or recesses disposed in other than a symmetrical arrangement on the tab. In all instances, however, the apertures or recesses are to be spaced apart from the conductive areas on the tab so that the locking mechanism is independent of the terminal contact interface in a receiving socket. Such an arrangement avoids the need for special contacts with projections, and is particularly useful for printed circuit boards having all the circuit patterns and terminals on one side of the board. It will be appreciated, however, that the locking means within the receiving socket may either be a resilient moveable projecting member as illustrated in FIG. 5, or it can be a fixed projection on the interior wall of the socket, in which case resiliency can be provided either by plastic flow or resilient contact members. Further, the lock-in projections can be on the same side of the socket as the firing contacts, or the projections can be on the opposite side of the socket from that on which the contacts are located. It is also contemplated that in some applications it may desireable to have resilient fingers on both sides of the socket.

The flash actuating circuitry functions as follows upon the terminals 20-25 being connected to a source of firing pulses. Assuming that none of the lamps have been flashed, upon occurrence of a first firing pulse across terminals 20 and 21, this pulse will be directly applied to the lead-in wires of the first connected flashlamp 11, whereupon the lamp 11 flashes and becomes an open circuit between its lead-in wires 11a and 11b. In the electronic circuit described in the aforementioned U.S. Pat. No. 3,618,492, a monitoring function is provided wherein a current of limited predetermined maximum value is applied through each unexpended flashlamp. This monitoring current is generated prior to the ignition of a given one of the flashlamps. In this manner, alignment signals are derived which function to align the flashlamp sequencing circuit to bypass inoperative flashlamps. This monitoring function is dependent upon the resistance across the lamp lead-in wires. Thus, if the monitoring circuit senses a significantly higher resistance across the lamp lead-in wires, say for example, higher than 50 ohms, the selective terminal connected to that lamp will be bypassed, and the firing pulse will be applied across the operative lamp connected to the next successive selective terminal. On the other hand, if the monitoring circuit senses a resistance below the preselected level (that is below about 50 ohms) a firing pulse will be applied to the selective terminal connected to that lamp.

In the present instance, with the first lamp 11 having been fired, the monitoring circuit will cause the firing pulse alignment to bypass terminal 21 and proceed to terminal 22, to which the unexpended lamp 12 is directly connected. Hence, when the next firing pulse occurs, it is applied directly to the second lamp 12, thereby firing that lamp. In like manner the third firing pulse is applied via terminals 20 and 23 to fire lamp 13. The fourth firing pulse is applied via terminals 20 and 24 to fire lamp 14, and the fifth's firing pulse applied via terminals 20 and 25 to fire lamp 15. As each lamp flashes, the reflective coating 34 causes the flash illumination to be directed in front of the array.

Figure 6:
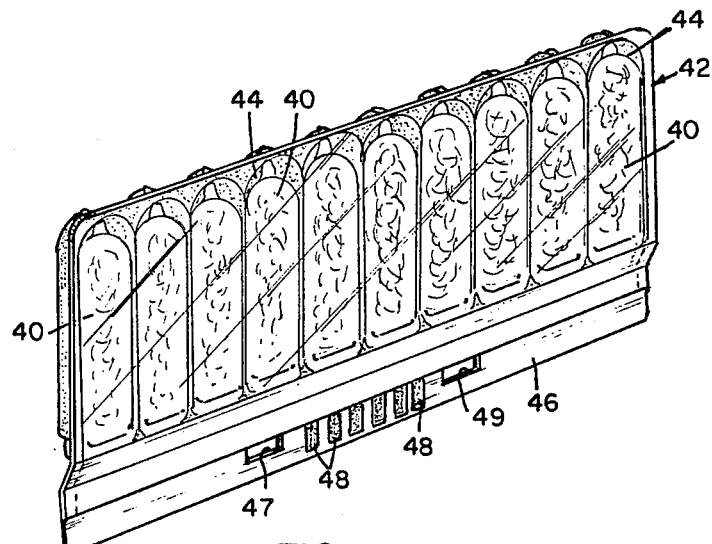
FIG. 6 is a perspective view of another embodiment of a multilamp photoflash unit in accordance with the invention.

Although the described embodiments have referred to the use of five lamps in a horizontal linear array which employs a relatively narrow connecting tab, it is contemplated that the construction may be applied to an array of two or more lamps which may be disposed in an arrangement that is other than linear and employs a connecting tab which is as wide as or wider than the printed circuit board. Thus, for example, FIG. 6 illustrates a specific alternative embodiment which employs ten lamps 40 disposed in a horizontal linear array in a one-piece housing 42 having a back portion with reflector cavities 44 facing unidirectionally. Other than for employing ten cavities and having somewhat different overall dimensions, the housing 42 is essentially the same as the housing 30 described with respect to FIGS. 1–3. The photoflash unit of FIG. 6 employs a printed circuit board having a projecting tab 46 which is actually wider than the main portion of the circuit board. Disposed on the circuit board tab 46 are a plurality of conductive terminal areas 48 which extend below and exteriorly of the secured housing enclosure. One each side of the array of terminals 48, the tab 46 contains a symmetrically disposed pair of apertures or recesses 47 and 49, which function in the same manner as the previously described openings 36 and 38 to render the unit securely engageable in a receiving socket. If, as illustrated, five selective terminals and a common terminal are employed to control the firing of ten lamps, selective switching circuitry may be employed for respective lamp pairs, as described in copending applications Ser. Nos. 156,983 and 156,991, both filed June 6, 1980 and assigned to the present assignee. The lamps are assembled to the circuit board and the circuit board is enclosed and secured within the housing 42 in the same manner described with respect to the embodiment of FIGS. 1–3.

Hence, although the invention has been described with respect to a specific embodiment, it will be appreciated that modifications and changes may be made by those skilled in the art without departing from the true spirit and scope of the invention. For example, the housing 30, may be found of materials other than cellulose propionate, such as other thermoplastic films; housing constructions other than the one-piece type may be employed; the circuit board may be formed of a material other than phenolic, such as enamel coated steel or polystyrene, and may be an integral part of the housing; and conductive materials other than copper may be employed for providing the circuit patterns.

We claim:

1. In a multilamp photoflash unit connectable to a source of firing pulses, said unit including a printed circuit board having electrically conductive circuit patterns disposed on a surface thereof, said circuit patterns including a plurality of terminal areas at one side edge of said circuit board that are selectively interconnected with a plurality of lamp contact areas, and a plurality of flashlamps each having a pair of lead-in wires secured in electrical connection with respective ones of said lamp contact areas, all of said terminal areas and said lamp contact areas connected to said lead-in wires being disposed on the same one side of said circuit board, the improvement comprising a flat projecting tab at said one side edge of said circuit board upon which said terminal areas are located adjacent to one another, and a plurality of engageable means in the form of apertures or recesses contained in said tab and spaced apart from said terminal areas and said one side edge, said tab being insertable in a receiving socket of a firing pulse source for connecting said terminal areas to respective contacts of said firing pulse source, and said engageable means being disposed on said tab in nonalignment with any of said terminal areas with respect to the direction of insertion into said receiving socket, whereby said apertures of recesses render said tab releasably engageable by socket means independent of said firing pulse contacts for securely retaining said photoflash unit in said socket.

2. The photoflash unit of claim 1 wherein said engageable means are symmetrically disposed on said tab.

3. The photoflash unit of claim 2 wherein said tab contains two of said symmetrically disposed engageable means.

4. The photoflash unit of claim 3 wherein said two symmetrically disposed engageable means comprise rectangular openings through said tab.

5. The photoflash unit of claim 3 wherein said two engageable means are symmetrically disposed on opposite sides of said plurality of terminal areas.

6. The photoflash unit of claim 1 wherein said circuit board has a substantially rectangular shape with a projecting tab at a longer side thereof, said tab being at least as wide as the longer side of the circuit board from which said tab projects.

7. The photoflash unit of claim 6 wherein said tab contains two of said engageable means which are symmetrically disposed on opposite sides of said plurality of terminal areas.

8. The photoflash unit of claim 1 wherein said circuit board has a substantially rectangular shape with a projecting tab at a longer side thereof, said tab being narrower in width than said longer side of the circuit board from which said tab projects.

9. The photoflash unit of claim 8 wherein said tab contains two of said engageable means which are symmetrically disposed on opposite sides of said plurality of terminal areas.

10. The multilamp photoflash unit of claim 1 wherein said unit further includes a one-piece housing member having a light transmitting front portion folded over a back portion containing a plurality of lamp-receiving cavities, each of said plurality of flashlamps are disposed in a respective one of said cavities and enclosed by said folded-over housing member, said circuit board is joined to said housing member, and said tab of the circuit board containing the terminal areas and engageable means extends below said folded-over housing member.

11. The photoflash unit of claim 10 wherein said housing member contains a linear fold separating said front and back portions and disposed horizontally along the top of said housing member, said back portion of the housing member includes a first tab means extending below said cavities, said front portion of the housing member includes a window area adjacent said lamps and a second tab means extending below said window area, and further including respective means securing said front portion to said back portion along the sides and bottom of said folded-over housing member, thereby providing a second enclosure about said lamps, a portion of said circuit board being sandwiched between and secured to said first and second tab means of the housing member with said circuit board tab extending below and exteriorly of said secured enclosure.

* * * * *

UNITED STATES PATENT AND TRADEMARK OFFICE
CERTIFICATE OF CORRECTION

PATENT NO. : 4,326,240
DATED : April 20, 1982
INVENTOR(S) : DAVID R. BROADT; JOHN W. SHAFFER It is certified that error appears in the above-identified patent and that said Letters Patent are hereby corrected as shown below:

Column 6, Line 21 delete "a" and insert (-as-)

Column 8, Line 30 delete "of" and insert (-or-)

Column 10, Line 6 delete "second" and insert (-secured-)

Signed and Sealed this

Twenty-seventh Day of July 1982

[SEAL]

Attest:

Attesting Officer

GERALD J. MOSSINGHOFF
Commissioner of Patents and Trademarks